United States Patent
Abugharbieh et al.

(10) Patent No.: US 7,535,399 B2
(45) Date of Patent: May 19, 2009

(54) REFERENCE VOLTAGE SHIFTING TECHNIQUE FOR OPTIMIZING SNR PERFORMANCE IN PIPELINE ADCS WITH RESPECT TO INPUT SIGNAL

(75) Inventors: Khaldoon Abugharbieh, San Jose, CA (US); Ping Jing, Cupertino, CA (US)

(73) Assignee: LSI Corporation, Milpitas, CA (US)

( * ) Notice: Subject to any disclaimer, the term of this patent is extended or adjusted under 35 U.S.C. 154(b) by 4 days.

(21) Appl. No.: 11/693,618

(22) Filed: Mar. 29, 2007

(65) Prior Publication Data
US 2008/0238737 A1 Oct. 2, 2008

(51) Int. Cl.
*H03M 1/12* (2006.01)
(52) U.S. Cl. .................. 341/156; 341/155; 341/161
(58) Field of Classification Search .............. 341/155, 341/156, 161, 120
See application file for complete search history.

(56) References Cited

U.S. PATENT DOCUMENTS

| | | | |
|---|---|---|---|
| 6,515,611 B1 * | 2/2003 | Fetterman et al. | 341/161 |
| 6,545,628 B1 * | 4/2003 | Aram | 341/155 |
| 6,744,395 B1 * | 6/2004 | Perelman et al. | 341/161 |
| 6,784,824 B1 * | 8/2004 | Quinn | 341/172 |
| 6,894,631 B1 * | 5/2005 | Bardsley | 341/120 |
| 6,987,477 B1 * | 1/2006 | Aude | 341/161 |
| 6,992,611 B1 * | 1/2006 | Lili et al. | 341/161 |
| 7,026,968 B1 * | 4/2006 | Ali | 341/120 |
| 2004/0100400 A1 * | 5/2004 | Perelman et al. | 341/155 |
| 2006/0049973 A1 * | 3/2006 | Dosho et al. | 341/161 |
| 2006/0227025 A1 * | 10/2006 | El-Sankary et al. | 341/120 |

OTHER PUBLICATIONS

Abo, Andrew M. et al., "A 1.5-V, 10-bit, 14.3-MS/s CMOS Pipeline Analog-to-Digital Converter", IEEE Journal of Solid-State Circuits, vol. 34, No. 5, May 1999, pp. 599-606.

* cited by examiner

*Primary Examiner*—Jean B Jeanglaude
(74) *Attorney, Agent, or Firm*—Christopher P. Maiorana, PC

(57) ABSTRACT

An apparatus comprising a first circuit and a second circuit. The first circuit may be configured to generate a plurality of digital intermediate signals in response to an analog input signal, a first set of threshold and reference voltages and a second set of threshold and reference voltages, where the threshold and reference voltages of the first set are shifted with respect to corresponding threshold and reference voltages of the second set. The second circuit may be configured to generate a digital output signal in response to the plurality of digital intermediate signals.

19 Claims, 9 Drawing Sheets

AN AC COUPLED SIGNAL (a)

A DC COUPLED POSITIVE ONLY SIGNAL (b)

| | | | | | | | | |
|---|---|---|---|---|---|---|---|---|
| STAGE1 | BIT11 | BIT12 | 0 | 0 | 0 | 0 | 0 | 0 |
| STAGE2 | 0 | BIT21 | BIT22 | 0 | 0 | 0 | 0 | 0 |
| STAGE3 | 0 | 0 | BIT31 | BIT32 | 0 | 0 | 0 | 0 |
| STAGE4 | 0 | 0 | 0 | BIT41 | BIT42 | 0 | 0 | 0 |
| STAGE5 | 0 | 0 | 0 | 0 | BIT51 | BIT52 | 0 | 0 |
| STAGE6 | 0 | 0 | 0 | 0 | 0 | BIT61 | BIT62 | 0 |
| STAGE7 + | 0 | 0 | 0 | 0 | 0 | 0 | BIT71 | BIT72 |
| ADC OUTPUT | BIT7 | BIT6 | BIT5 | BIT4 | BIT3 | BIT2 | BIT1 | BIT0 |

US 7,535,399 B2

REFERENCE VOLTAGE SHIFTING TECHNIQUE FOR OPTIMIZING SNR PERFORMANCE IN PIPELINE ADCS WITH RESPECT TO INPUT SIGNAL

FIELD OF THE INVENTION

The present invention relates to analog-to-digital conversion generally and, more particularly, to a reference voltage shifting technique for optimizing signal-to-noise-ratio (SNR) performance in pipeline analog-to-digital converters (ADCs) with respect to input signal.

BACKGROUND OF THE INVENTION

Referring to FIGS. 1(a-b), diagrams are shown illustrating ac-coupled (FIG. 1a) and dc-coupled (FIG. 1b) signals. Most analog circuitry deals with signals that are ac-coupled or have symmetric swing with respect to zero as shown in FIG. 1a. Since the ac-coupled signals have symmetric swing with respect to zero, it is efficient to design an analog-to-digital converter (ADC) to have an input range of [−FS/2, FS/2], where −FS/2 and FS/2 correspond to the lowest and the highest codes, respectively.

However, in some systems, different signals are used. For example, the wobble signal in a Digital Versatile Disc Recordable (DVD-R) chip is a dc-coupled, positive only signal. The wobble signal does not have a symmetric swing with respect to zero (as illustrated by the signal in FIG. 1b). In order to avoid saturating the ADC output, only half of the full scale (FS) of the ADC can be used to digitize the signals (i.e., the input signal swing has to be limited to a range of [0, FS/2]). Because the range of the input signal is limited to half of the full scale of the ADC, 6 dB SNR (signal-to-noise-ratio) of the ADC output will be lost. The loss of 6 dB SNR means the ADC can only achieve ($N_{design}$−1) bits of the effective number of bits (ENOB) even if an ideal ADC is used.

A technique that optimizes signal-to-noise-ratio (SNR) performance in pipeline analog-to-digital converters (ADCs) with respect to input signal to regain the 6 dB SNR would be desirable.

SUMMARY OF THE INVENTION

The present invention concerns an apparatus comprising a first circuit and a second circuit. The first circuit may be configured to generate a plurality of digital intermediate signals in response to an analog input signal, a first set of threshold and reference voltages and a second set of threshold and reference voltages, where the threshold and reference voltages of the first set are shifted with respect to corresponding threshold and reference voltages of the second set. The second circuit may be configured to generate a digital output signal in response to the plurality of digital intermediate signals.

The objects, features and advantages of the present invention include providing a reference voltage shifting technique for optimizing signal-to-noise-ratio (SNR) performance in pipeline analog-to-digital converters (ADCs) with respect to input signal that may (i) utilize more of the signal swing than conventional techniques, (ii) have reference voltages in a first stage of a pipeline ADC that are different from subsequent stages and/or (iii) be useful for DC coupled signals that are positive/negative only.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
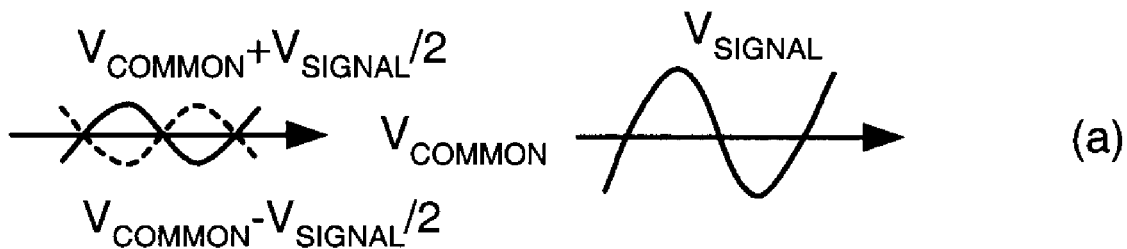
FIGS. 1(a-b) are diagrams illustrating ac-coupled and dc-coupled signals.
Figure 1:
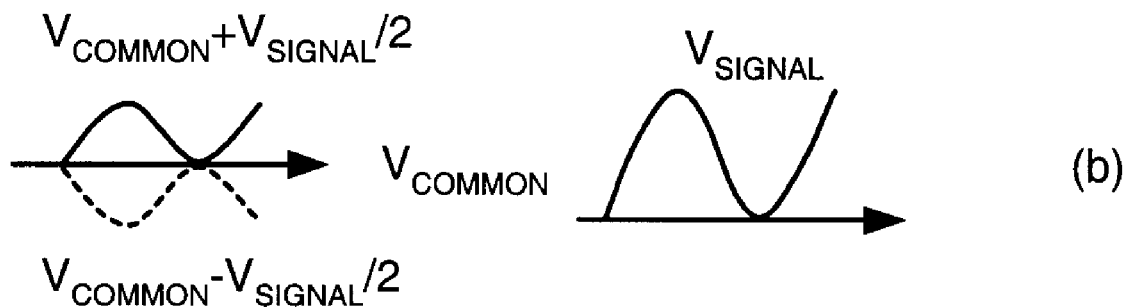
Figure 2:
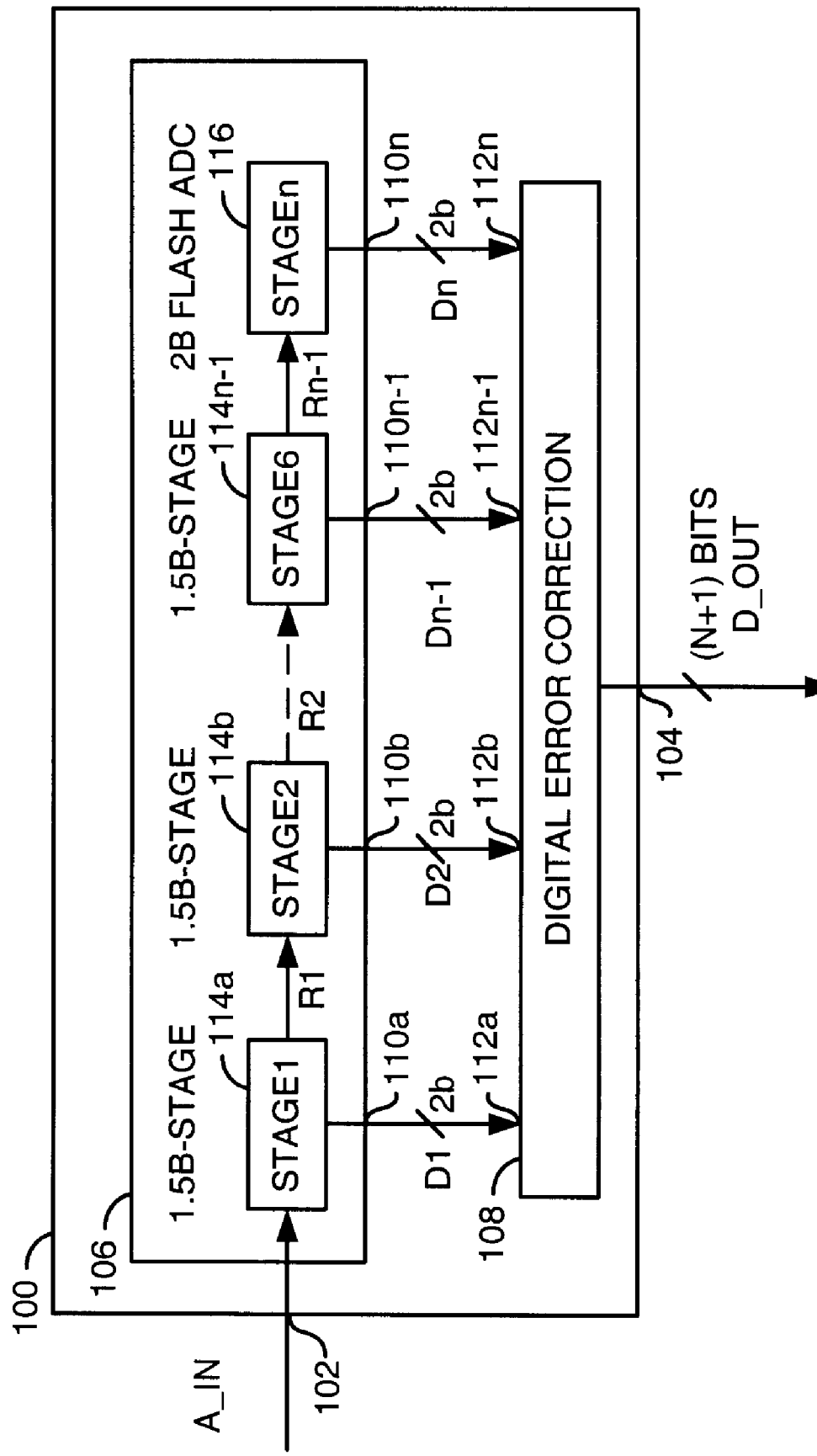
FIG. 2 is a diagram illustrating a pipeline analog-to-digital converter architecture in accordance with the present invention.

Referring to FIG. 2, a block diagram is shown illustrating a pipeline analog-to-digital convertor (ADC) architecture 100 in accordance with a preferred embodiment of the present invention. The pipeline ADC 100 may have an input 102 that may receive an analog input signal (e.g., A_IN) and an output 104 that may present a digital output signal (e.g., D_OUT). The signal A_IN may be, in one example, a DC coupled signal. The signal A_IN may have a positive or negative only swing. The signal D_OUT may comprise a multi-bit signal. In one example, the signal D_OUT may be implemented as an 8-bit signal. However, other bit widths may be implemented accordingly to the design criteria of a particular implementation.

The architecture 100 may comprise a block (or circuit) 106 and a block (or circuit) 108. For an n-bit pipeline ADC, the block 106 may be implemented as (n−2) 1.5 b stages and a 2 b flash ADC stage. The block 108 may be implemented as a digital error correction block. The block 106 may have a number of outputs 110a-110n that may present a number of signals (e.g., D1-Dn). The signals D1-Dn may be implemented, in one example, as digital intermediate signals. In one example, the signals D1-Dn may be implemented as 2-bit digital signals. However, for the signals D2-Dn, other bit widths may be implemented accordingly to meet the design criteria of a particular implementation. The block 106 may be configured to generate the signals D1-Dn in response to the signal A_IN.

The block 108 may have a number of inputs 112a-112n that may receive the signals D1-Dn and an output the may present the signal D_OUT. The block 108 may be configured to generate the signal D_OUT by combining the signals D1-Dn with digital error correction to produce a designed number of bits at the output of the architecture 100.

In one example, the block 106 may be implemented having a number (e.g., N) of stages. In one example, the N stages may comprise (N−1) stages 114a-114 (n−1) and a stage 116. The stages 114a-114 (n−1) may be implemented, in one example, as 1.5-bit stages. The stage 116 may be implemented, in one example, as a 2-bit flash ADC. Each of the stages 114a-114 (n−1) may be configured to generate one of the signals D1-D(n−1) and a respective one of a plurality of residual output signals (e.g., R1-R(n−1)) in response to a respective input signal. The stage 116 may be configured to generate the signal Dn in response to the signal R(n−1).

Figure 3:
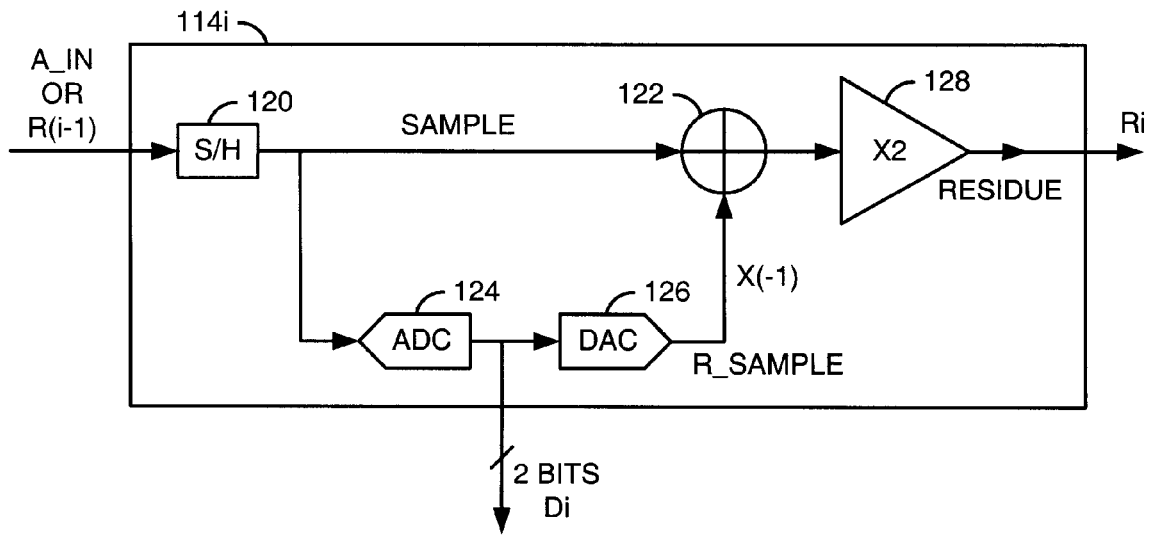
FIG. 3 is a more detailed diagram of a 1.5 b stage of FIG. 2.

Referring to FIG. 3, a block diagram is shown illustrating an example implementation of a stage 114i. In one example, each of the stages 114a-114 (n−1) may be configured to resolve two bits (e.g., the signal Di) in response to a respective input signal with a sub-ADC. Each of the stages 114a-114 (n−1) may be further configured to subtract the two-bit value from the respective input signal to generate a respective residue signal. Each of the stages 114a-114 (n−1) may amplify the respective residue signal by a gain of two to generate a respective residual output signal (e.g., the signal Ri). However, other gain values may be implemented accordingly for the stages 114b-114 (n−1) depending upon the bit widths implemented for the signals D2-Dn.

In one example, the stage 114i may comprise a block (or circuit) 120, a block (or circuit) 122, a block (or circuit) 124, a block (or circuit) 126 and a block (or circuit) 128. The block 120 may be implemented, in one example, as a sample-and-hold (S/H) circuit. The block 122 may be implemented, in one example, as an analog adder circuit. The block 124 may be implemented, in one example, as an analog-to-digital converter (ADC) circuit. The block 126 may be implemented, in one example, as an digital-to-analog converter (DAC) circuit. The block 128 may be implemented, in one example, as an amplifier circuit.

The block 120 may have an input that may receive an input signal and an output that may present a signal (e.g., SAMPLE) to a first input of the block 122 and an input of the block 124. When the stage 114i is implemented as the first stage of the block 106, the input signal may comprise the signal A_IN. When the stage 114i is implemented as a stage other than the first stage of the block 106, the input signal may comprise the residual output signal R(i−1) from the previous stage. The block 120 may be configured to sample the input signal and hold the sample for a predetermined period of time.

The block 124 may be configured to convert the signal SAMPLE from the analog domain to a digital domain. The block 124 may have an output that may present the digital version of the signal SAMPLE as a digital intermediate signal (e.g., Di). In one example, the block 124 may be configured to generate the signal Di as a two-bit signal. However, for the stages 114b-114 (n−1), other bit widths may be implemented accordingly to meet the design criteria of a particular implementation.

The block 126 may have an input that may receive the signal Di and an output that may present a signal (e.g., R_SAMPLE) to a second input of the block 122. The block 126 may be configured to convert the signal Di from the digital domain to the analog domain. In one example, the block 126 may be configured to generate the signal R_SAMPLE having three voltage steps. However, for the stages 114b-114 (n−1), other steps may be implemented accordingly to meet the design criteria of a particular implementation. The signal R_SAMPLE may have a complementary sign (or polarity) from the signal SAMPLE (e.g., [sign of R_SAMPLE] equals (−1)[sign of SAMPLE]).

In one example, the block 122 may be configured to add the signals SAMPLE and R_SAMPLE to generate a residue signal. In another example, the signal R_SAMPLE may be generated with the same sign (or polarity) as the signal SAMPLE and the block 122 may be configured to generate the residue signal by subtracting the signal R_SAMPLE from the signal SAMPLE. The residue signal may be presented to an input of the block 128. In one example, the block 128 may be configured to generate a residual output signal (e.g., Ri) by amplifying the residue signal received from the block 122 by a gain of two. However, for the stages 114b-114 (n−1), other gains may be implemented accordingly to meet the design criteria of a particular implementation.

Figure 4:
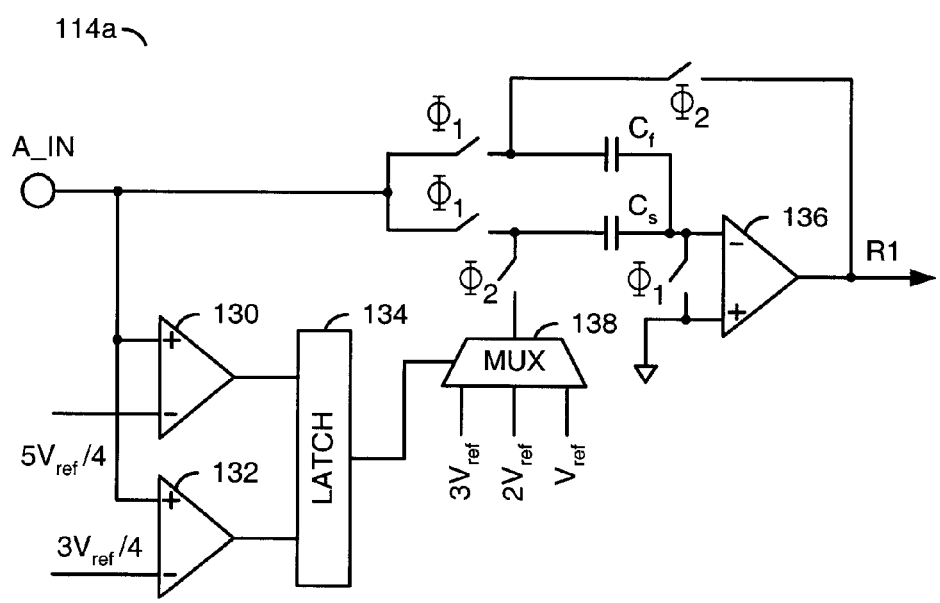
FIG. 4 is a diagram illustrating an example implementation of a first 1.5 b stage of the ADC of FIG. 2 implemented in accordance with the present invention.

Referring to FIG. 4, a diagram is shown illustrating an example implementation of the stage 114a of FIG. 2 in accordance with a preferred embodiment of the present invention. The stage 114a is generally illustrated as a single-ended configuration for simplicity. However, in a preferred embodiment a fully differential structure may be used to implement a real circuit design. In one example, the stage 114a may comprise a block (or circuit) 130, a block (or circuit) 132, a block (or circuit) 134, a block (or circuit) 136 and a block (or circuit) 138. The block 130 may be implemented as a comparator circuit. The block 132 may be implemented as a comparator circuit. The block 134 may be implemented as a latch circuit. The block 136 may be implemented, in one example, as an operational amplifier (or op-amp) circuit. The block 138 may be implemented as a multiplexer circuit.

In one example, the stage 114a may comprise a switched-capacitor implementation. The switched capacitor implementation may operate on a clock signal having two non-overlapping phases (e.g., $\Phi_1$ and $\Phi_2$). During $\Phi_1$, the analog input signal A_IN may be applied to the input of a sub-ADC formed by the first comparator 130, the second comparator 132 and the latch 134. In one example, the signal A_IN may have a swing of [0, 2V$_{ref}$]. The comparators 130 and 132 may have thresholds at $5V_{ref}/4$ and $3V_{ref}/4$, respectively. At the same time, in the single-ended implementation, the analog input signal A_IN may also be presented to a first terminal of a first sampling capacitor $C_s$ and a first terminal of a second sampling capacitor $C_f$. A second terminal of the first sampling capacitor $C_s$ and a second terminal of the second sampling capacitor $C_f$ are connected to a first input (e.g., an inverting input) of the op-amp 136. A second input (e.g., a non-inverting input) of the op-amp 136 may be connected to a ground terminal. During $\Phi_1$, the first input of the op-amp 136 may also be connected to the ground terminal. At the end of $\Phi_1$, the signal R1 is sampled across the first sampling capacitor $C_s$ and the second sampling capacitor $C_f$ and the output of the sub-ADC is latched by the latch 134.

During $\Phi_2$, the first terminal of the second sampling capacitor $C_f$ is connected to an output of the op-amp 136 to form a feedback loop around the op-amp 136. At the same time, the first input of the op-amp 136 is disconnected from the ground terminal and the first terminal of the first sampling capacitor $C_s$ is switched to an output of the digital-to-analog convertor (DAC) formed by the multiplexer 138. The multiplexer 138 may be configured to select between three voltage values (e.g., $V_{ref}$, $2V_{ref}$, and $3V_{ref}$) based on an output from the latch 134. The signal R1 is presented at the output of the op-amp 136. The signal R1 is the residual output signal of the stage 114a, and is also the input to the next stage (e.g., 114b). However, the stage 114a may be implemented as a differential circuit corresponding to the single-ended implementation to meet the design criteria of a particular implementation.

To accommodate the input signal swinging from, for example, 0 to $2V_{ref}$, the threshold voltages used by the comparators 130 and 132 in the stage 114a are shifted from the threshold voltages used by the comparators 130 and 132 in the stages 114b-114(n−1), which are described below in connection with FIG. 5. For example, the threshold voltages presented to the comparators 130 and 132 are shifted when compared with the threshold voltages presented to the corresponding structures in the stages 114b-114 (n−1). For example, the threshold voltages in the stages 114b-114 (n−1) may be implemented as $V_{ref}/4$ and $-V_{ref}/4$ while the corresponding threshold voltages implemented in the stage 114a are $(V_{ref}+V_{ref}/4)$ and $(V_{ref}-V_{ref}/4)$, respectively. The three voltage values that may be presented at the output of the multiplexer 138 (e.g., $3V_{ref}$, $2V_{ref}$ and $V_{ref}$) are also different (e.g., shifted) from the corresponding voltage values (e.g., $V_{ref}$, 0, and $-V_{ref}$) implemented in the stages 114b-114 (n−1). The operation of the first stage and the subsequent stages 114b-114 (n−1) is generally the same. The residual output signal R1 may be expressed using the following equations:

$$R1 = \begin{cases} 2A_{in} - 3V_{ref}, & \text{if } A_{in} > V_{ref} + \dfrac{V_{ref}}{4} \\ 2A_{in} - 2V_{ref}, & \text{if } V_{ref} - \dfrac{V_{ref}}{4} \le A_{in} \le V_{ref} + \dfrac{V_{ref}}{4} \\ 2A_{in} - V_{ref}, & \text{if } A_{in} < V_{ref} - \dfrac{V_{ref}}{4} \end{cases}$$

Figure 5:
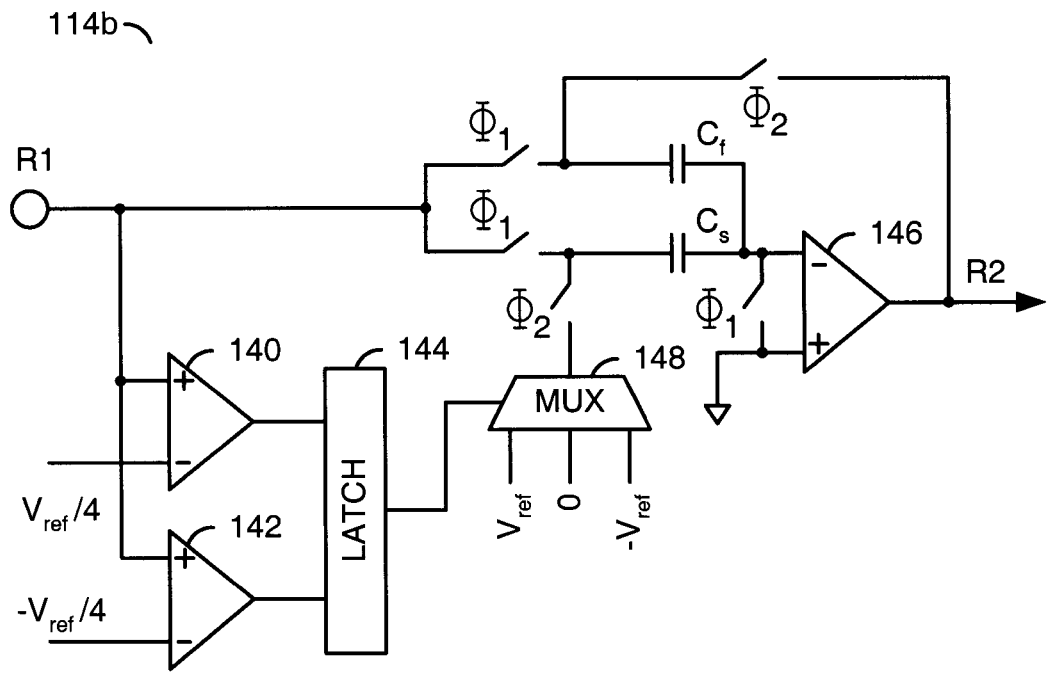
FIG. 5 is a diagram illustrating an example implementation of second and subsequent 1.5 b stages of the ADC of FIG. 2.

Referring to FIG. 5, a diagram is shown illustrating an example implementation of the stage 114b of FIG. 2. Each of the stages 114c-114 (n−1) may be implemented similarly to the stage 114b. The stage 114b is illustrated as a single-ended configuration for simplicity. However, in a preferred embodiment a fully differential structure may be used to implement a real circuit design. In one example, the stage 114b may comprise a block (or circuit) 140, a block (or circuit) 142, a block (or circuit) 144, a block (or circuit) 146 and a block (or circuit) 148. The block 140 may be implemented as a comparator circuit. The block 142 may be implemented as a comparator circuit. The block 144 may be implemented as a latch circuit. The block 146 may be implemented, in one example, as an operational amplifier (or op-amp) circuit. The block 148 may be implemented as a multiplexer circuit.

In one example, the stage 114b may comprise a switched-capacitor implementation. The switched capacitor implementation may operate on the clock having the two non-overlapping phases $\Phi_1$ and $\Phi_2$. During $\Phi_1$, the analog input signal (e.g., R1) may be applied to the input of a sub-ADC formed by the first comparator 140, the second comparator 142 and the latch 144. In one example, the signal R1 may have a swing of $[-V_{ref}, V_{ref}]$. The comparators 140 and 142 may have thresholds at $+V_{ref}/4$ and $-V_{ref}/4$, respectively. At the same time, in the single-ended implementation, the analog input signal R1 may also be presented to a first terminal of a first sampling capacitor $C_s$ and a first terminal of a second sampling capacitor $C_f$. A second terminal of the first sampling capacitor $C_s$ and a second terminal of the second sampling capacitor $C_f$ are connected to a first input (e.g., an inverting input) of the op-amp 146. A second input (e.g., a non-inverting input) of the op-amp 146 may be connected to a ground terminal. During $\Phi_1$, the first input of the op-amp 146 may also be connected to the ground terminal. At the end of $\Phi_1$, the signal R1 is sampled across the first sampling capacitor $C_s$ and the second sampling capacitor $C_f$ and the output of the sub-ADC is latched by the latch 144.

During $\Phi_2$, the first terminal of the second sampling capacitor $C_f$ is connected to an output of the op-amp 146 to form a feedback loop around the op-amp 146. At the same time, the first input of the op-amp 146 is disconnected from the ground terminal and the first terminal of the first sampling capacitor $C_s$ is switched to an output of the digital-to-analog convertor (DAC) formed by the multiplexer 148. The multiplexer 148 may be configured to select between three voltage values (e.g., $V_{ref}$, 0, and $-V_{ref}$) based on an output from the latch 144. The signal R2 is presented at the output of the op-amp 146. The signal R2 is the residual output signal of the stage 114b, and is also the input to the next stage (e.g., 114c). The signal R2 may be expressed by the following equations where $C_s=C_f$ is chosen for each 1.5 b stage 114:

$$R2 = \begin{cases} 2R1 - V_{ref}, & \text{if } R1 > \dfrac{V_{ref}}{4} \\ 2R1, & \text{if } -\dfrac{V_{ref}}{4} \le R1 \le \dfrac{V_{ref}}{4} \\ 2R1 + V_{ref}, & \text{if } R1 < -\dfrac{V_{ref}}{4} \end{cases}$$

However, the stages 114b-114 (n−1) may be implemented using differential circuits corresponding to the single-ended implementation to meet the design criteria of a particular implementation.

Figure 6:
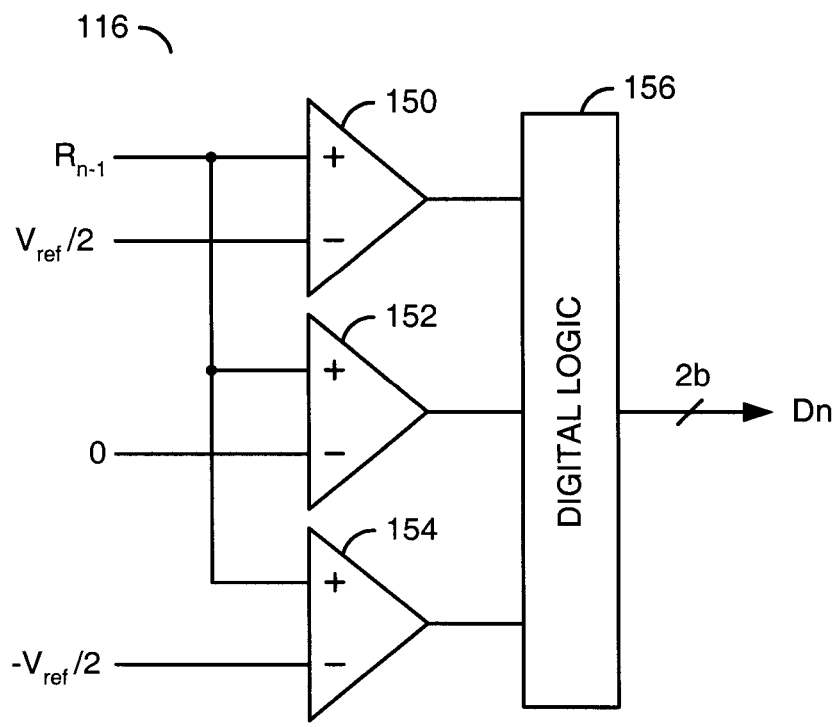
FIG. 6 is a diagram illustrating an example implementation of a 2 b flash ADC stage of FIG. 2.

Referring to FIG. 6, a block diagram is shown illustrating an example implementation of the stage 116 of FIG. 2. In one example, the stage 116 may comprise a block (or circuit) 150, a block (or circuit) 152, a block (or circuit) 154 and a block (or circuit) 156. The blocks 150-154 may be implemented, in one example, as voltage comparator circuits. The block 156 may be implemented, in one example, as a digital logic circuit. The signal R(n−1) may be presented to a first input of the block 150, a first input of the block 152 and a first input of the block 154. A first threshold voltage (e.g., $V_{ref}/2$) may be presented to a second input of the block 150. A second threshold voltage (e.g., 0) may be presented to a second input of the block 152. A third threshold voltage (e.g., $-V_{ref}/2$) may be presented to a second input of the block 154. In one example, a first inputs of the blocks 150-154 may be implemented as non-inverting inputs and the second inputs of the blocks 150-154 may be implemented as inverting inputs. The blocks 150-154 may be configured to subtract a voltage at the second input from a voltage presented to the first input and to assert an output when the voltage on the first input is greater than the voltage on the second input.

The block 156 may have a first input that may receive an output from the block 150, a second input that may receive an output from the block 152 and a third input that may receive an output from the block 154. The block 156 may have an output that may present the signal Dn. The circuit 156 may comprise logic configured to use the outputs of the comparators 150-154 to implement a predefined relationship between the signal R(n−1) and the signal Dn. In one example, the predefined relationship between the signal R(n−1) and the signal Dn may be summarized as in the following TABLE 1:

TABLE 1

| R(n − 1) | Dn[1] | Dn[0] |
|---|---|---|
| R(n − 1) > $V_{ref}/2$ | 1 | 1 |
| 0 < R(n − 1) ≤ $V_{ref}/2$ | 1 | 0 |
| −$V_{ref}/2$ < R(n − 1) ≤ 0 | 0 | 1 |
| R(n − 1) ≤ −$V_{ref}/2$ | 0 | 0 |

In a pipeline ADC, the last flash ADC stage may resolve two or more bits depending upon the design criteria of a particular implementation. In general, an n-bit flash ADC stage may be implemented using ($2^n$−1) comparators.

Figures 7, 8:
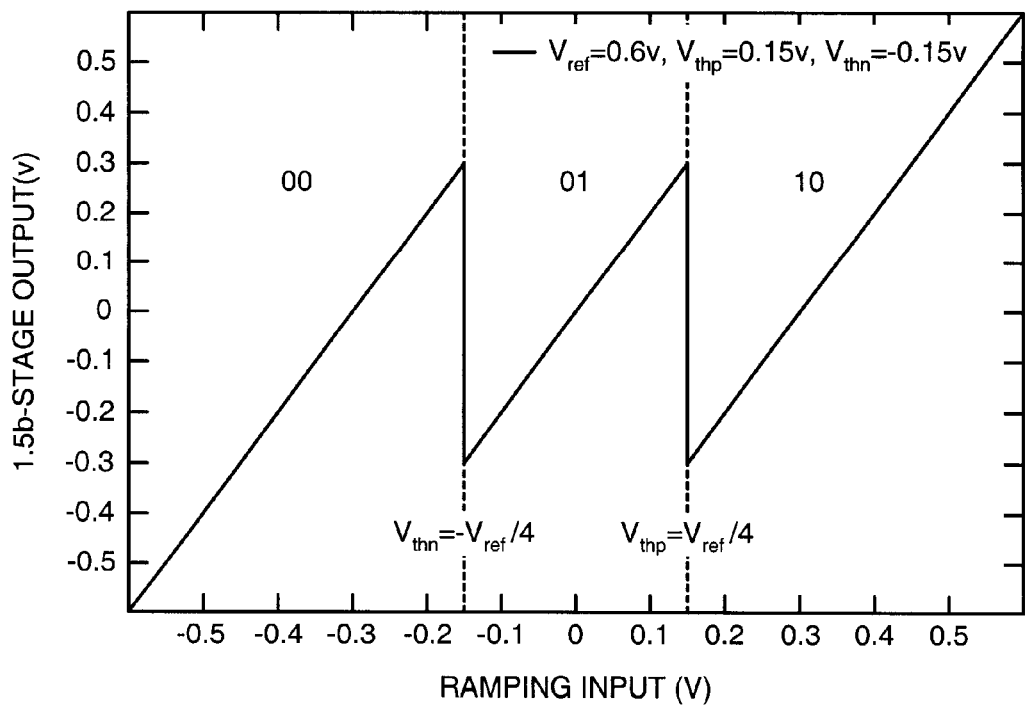
FIG. 7 is a table illustrating an example operation of an error correction block of FIG. 2.
FIG. 8 is a graph illustrating an example output of the first 1.5 b stage of FIG. 2 implemented using the circuit illustrated in FIG. 5 with a ramping input signal that swings from $-V_{ref}$ to $+V_{ref}$.

Referring to FIG. 7, a table is shown illustrating an example operation of the error correction block 108 of FIG. 2. In one example, the error correction block 108 may be configured to combine the outputs of the stages 114a-114 (n−1) and 116. For example, the block 108 may be configured to shift the output of each of the stages 114a-114 (n−1) and 116 by one bit to the right from the output of the previous stage and sum the shifted outputs together to obtain a final digital output (e.g., the signal D_OUT) for the architecture 101.

Referring to FIG. 8, a diagram is shown illustrating example outputs D1 and R1 of the stage 114a implemented using the circuit of FIG. 5 with a ramping input signal swinging from −$V_{ref}$ to $V_{ref}$. The signal R1 also ranges from −$V_{ref}$ to $V_{ref}$. The sub-ADC, formed by the comparators 140 and 142 and the latch 144, may present the signal D1 having any of three digital output codes (e.g., 00, 01 and 10) depending upon the input voltage.

Figure 9:
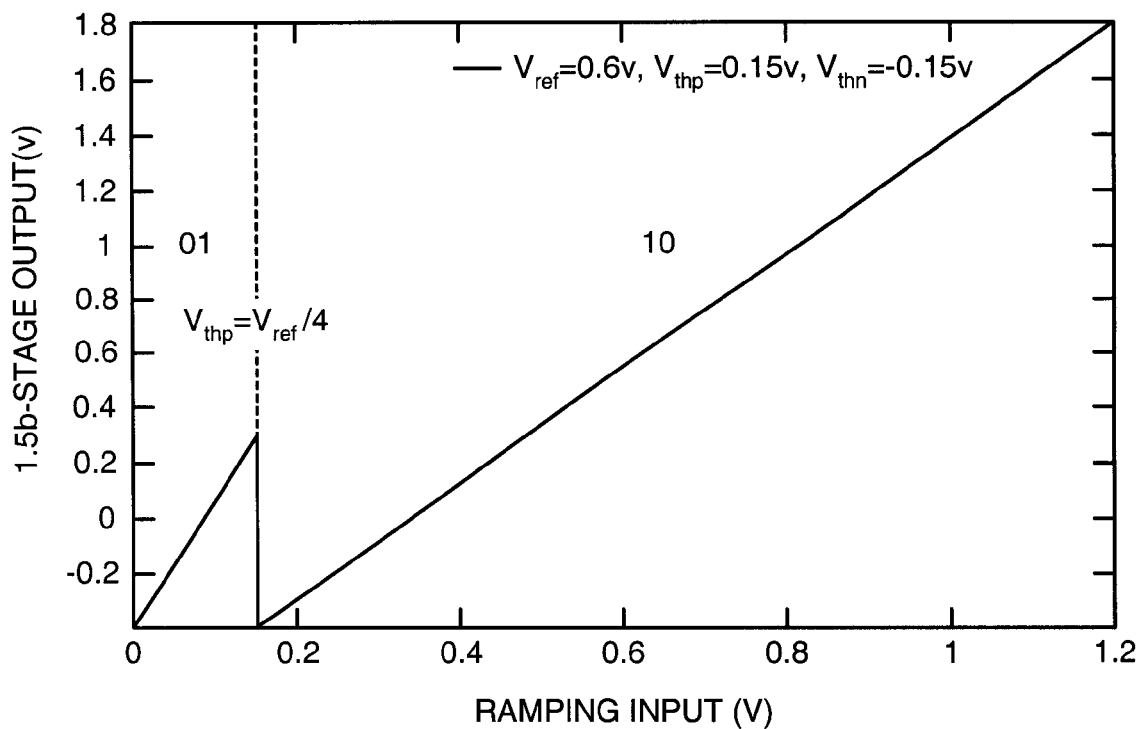
FIG. 9 is a graph illustrating an example output of the first 1.5 b stage of FIG. 2 implemented using the circuit illustrated in FIG. 5 with a ramping input signal that swings from 0 to $2V_{ref}$.

Referring to FIG. 9, a diagram is shown illustrating the outputs D1 and R1 of the stage 114a implemented using the circuit of FIG. 5 with a ramping signal swinging from 0 to 2$V_{ref}$. As may be observed, the residual output signal R1 of the stage 114a would swing from −$V_{ref}/2$ to 3$V_{ref}$ and the sub-ADC would only generate the signal D1 having two digital output codes (e.g., 01 and 10) depending upon the input voltage.

Figure 10:
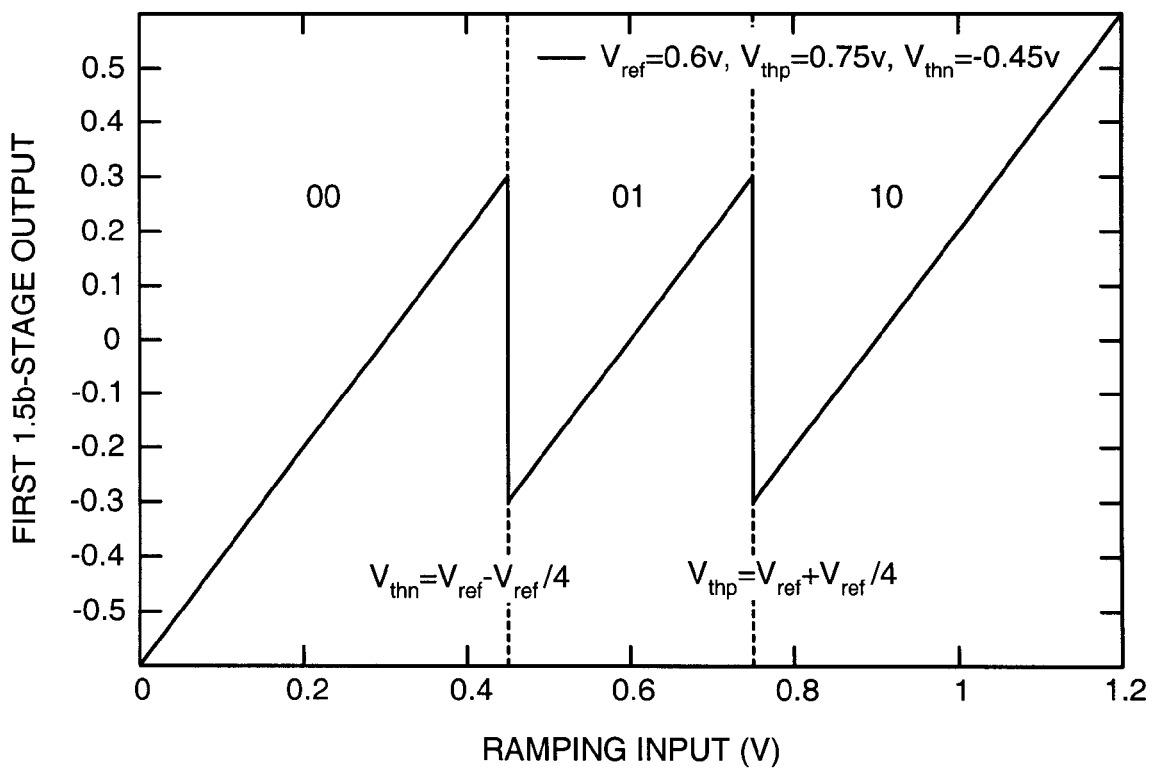
FIG. 10 is a graph illustrating an example output of the first 1.5 b stage of FIG. 2 implemented using the circuit illustrated in FIG. 4 with a ramping input signal that swings from 0 to $2V_{ref}$.

Referring to FIG. 10, a diagram is shown illustrating an example of the outputs D1 and R1 of the stage 114a implemented using the circuit of FIG. 4 and receiving a ramping input signal swinging from 0 to 2$V_{ref}$. The signal R1 presented at the output of the stage 114a implemented in accordance with the present invention would fall into the range of [−$V_{ref}$, $V_{ref}$], which means the subsequent stages 114b-114 (n−1) may be implemented with no reference voltage shift. The sub-ADC of the stage 114a would present the signal D1 having the three digital output codes 00, 01 and 10 depending upon the input voltage.

To illustrate the improved operations of the ADC 100 with shifted reference voltages implemented in the first stage, a comparison was made between two cases. MATLAB simulations were performed for an 8-bit implementation of the ADC 100 with and without the reference voltage shifting technique in accordance with the present invention (MATLAB is a trademark of The MathWorks, Inc., 3 Apple Hill Drive, Natick, Mass., 01760-2098). The results of the MATLAB simulations are illustrated in FIGS. 11(a-c) through 13(a-c) below.

Figure 11:
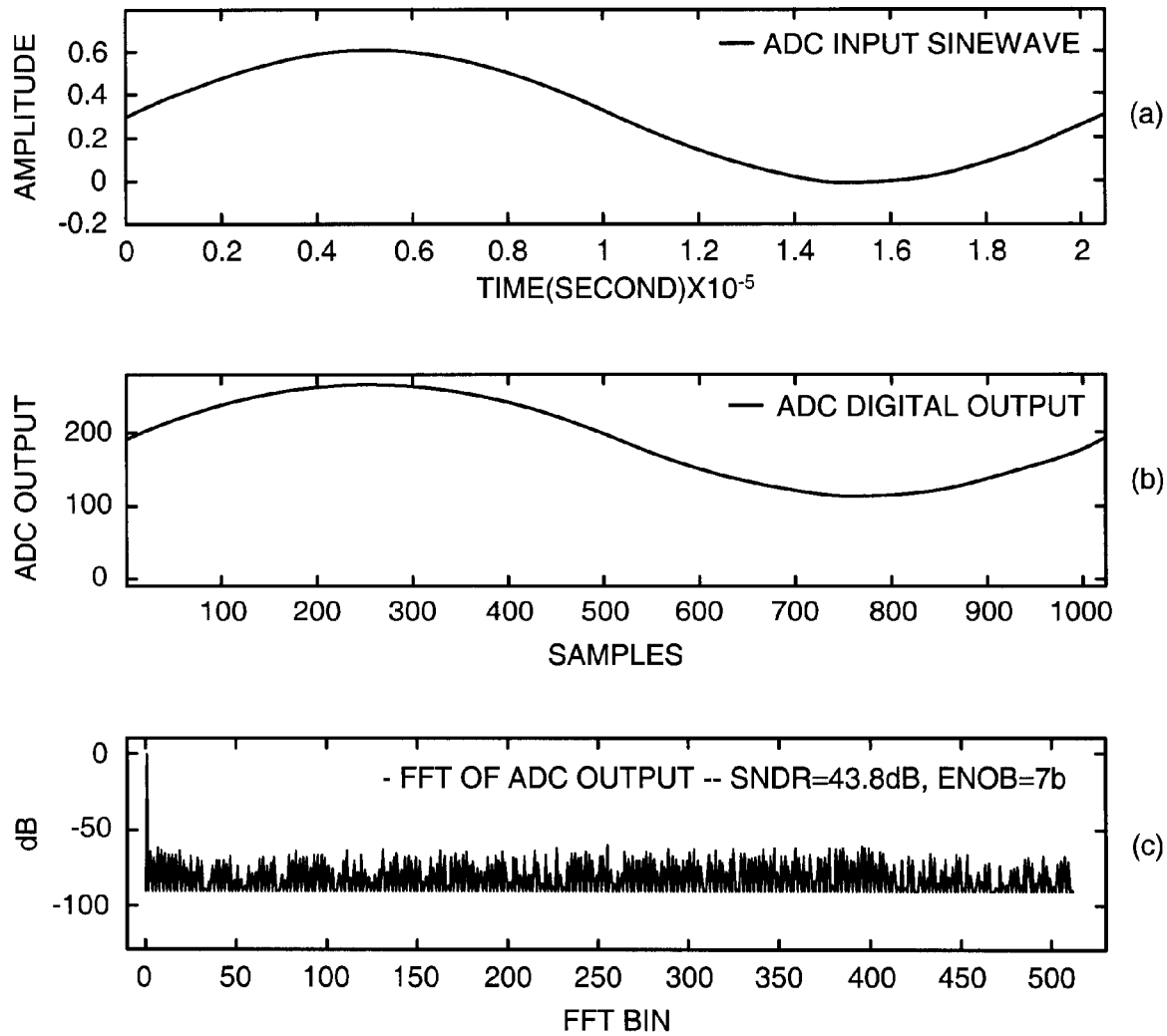
FIGS. 11(a-c) are graphs illustrating MATLAB simulation results of an 8-bit implementation of the ADC 100 of FIG. 2 with a ramping input signal that swings from 0 to $V_{ref}$, where $V_{ref}$ is 0.6v and all of the 1.5 b stages are implemented using the circuit of FIG. 5.

Referring to FIGS. 11(a-c), diagrams are shown illustrating MATLAB simulation results of the architecture 100 without the reference voltages changed in the stage 114a. The first graph (FIG. 11a) illustrates the input signal comprising a sine wave having a frequency of 48.8 kHz and swinging from 0–0.6V. The input signal goes into an 8-bit ADC which has a full scale of (−0.6V, 0.6V). 1024 samples are generated for one sine wave period. The digitized sine wave presented at the output 104 of the ADC 100 is plotted in the second graph (FIG. 11b). The second graph illustrates that the output of the ADC 100 ranges from 127 to 255 which is only half of the 8-bit full scale of the ADC 100. A 1024 point Fast Fourier Transform (FFT) of the output of the ADC 100 is plotted in the last graph (FIG. 11c). The ENOB of the ADC 100 may be calculated using the equation ENOB=(SNDR−1.76)/6.02. The result shows that the 8-bit ADC 100 without the reference voltage shifting technique of the present invention has only 7 bits ENOB. The one bit loss in the ENOB is because only half of the full scale of the ADC 100 is used as discussed above.

Figure 12:
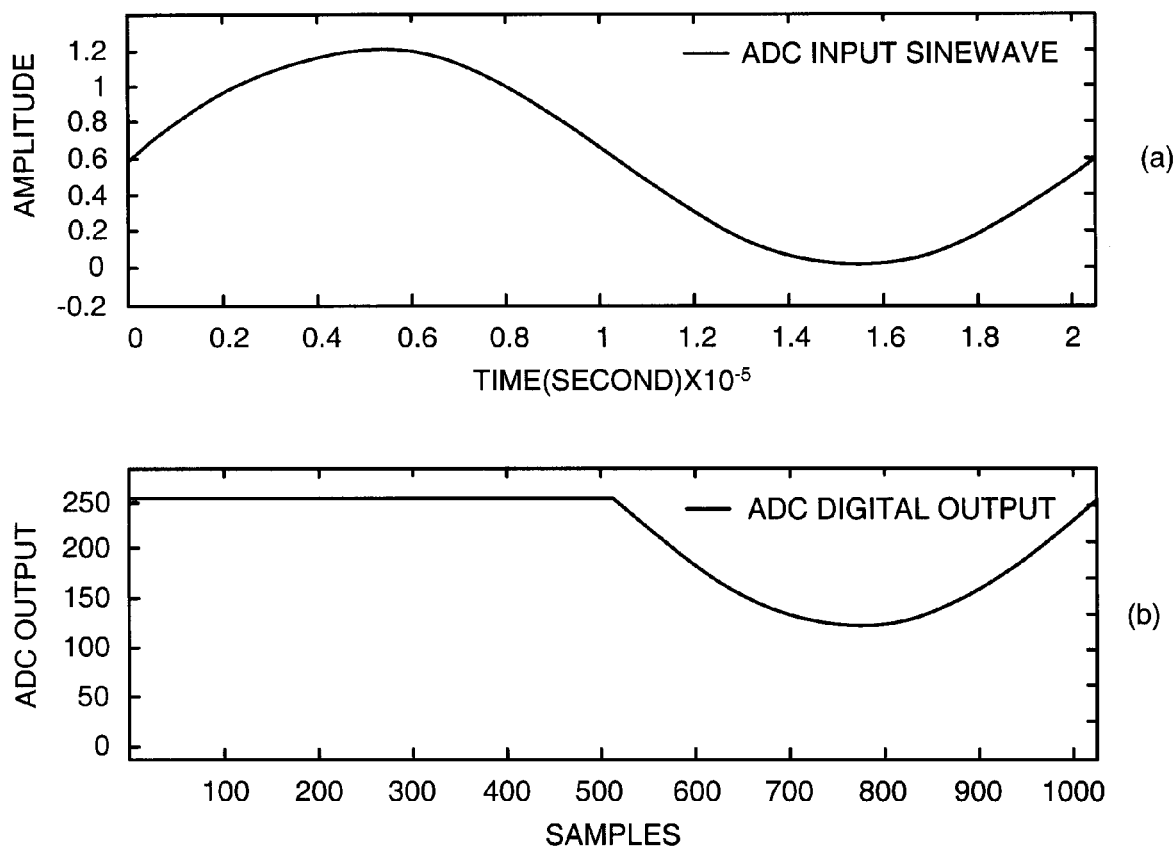
FIGS. 12(a-b) are graphs illustrating MATLAB simulation results of an 8-bit implementation of the ADC 100 of FIG. 2 with a ramping input signal that swings from 0 to $2V_{ref}$, where $V_{ref}$ is 0.6v and all of the 1.5 b stages are implemented using the circuit of FIG. 5.

Referring to FIGS. 12(a-b), graphs are shown illustrating the results with an input sine wave ranging between 0 to 1.2V. The first graph (FIG. 12a) illustrates the input, and the second graph (FIG. 12b) illustrates the digital output D_OUT of the ADC 100. As may be observed, the output of the ADC 100 without the reference voltage shifting technique of the present invention would be saturated because the input swings out of the ADC full scale. Therefore, the ADC 100 implemented without the reference voltage shifting technique of the present invention would not process an input signal that swings above 0.6V without saturating the ADC output.

Figure 13:
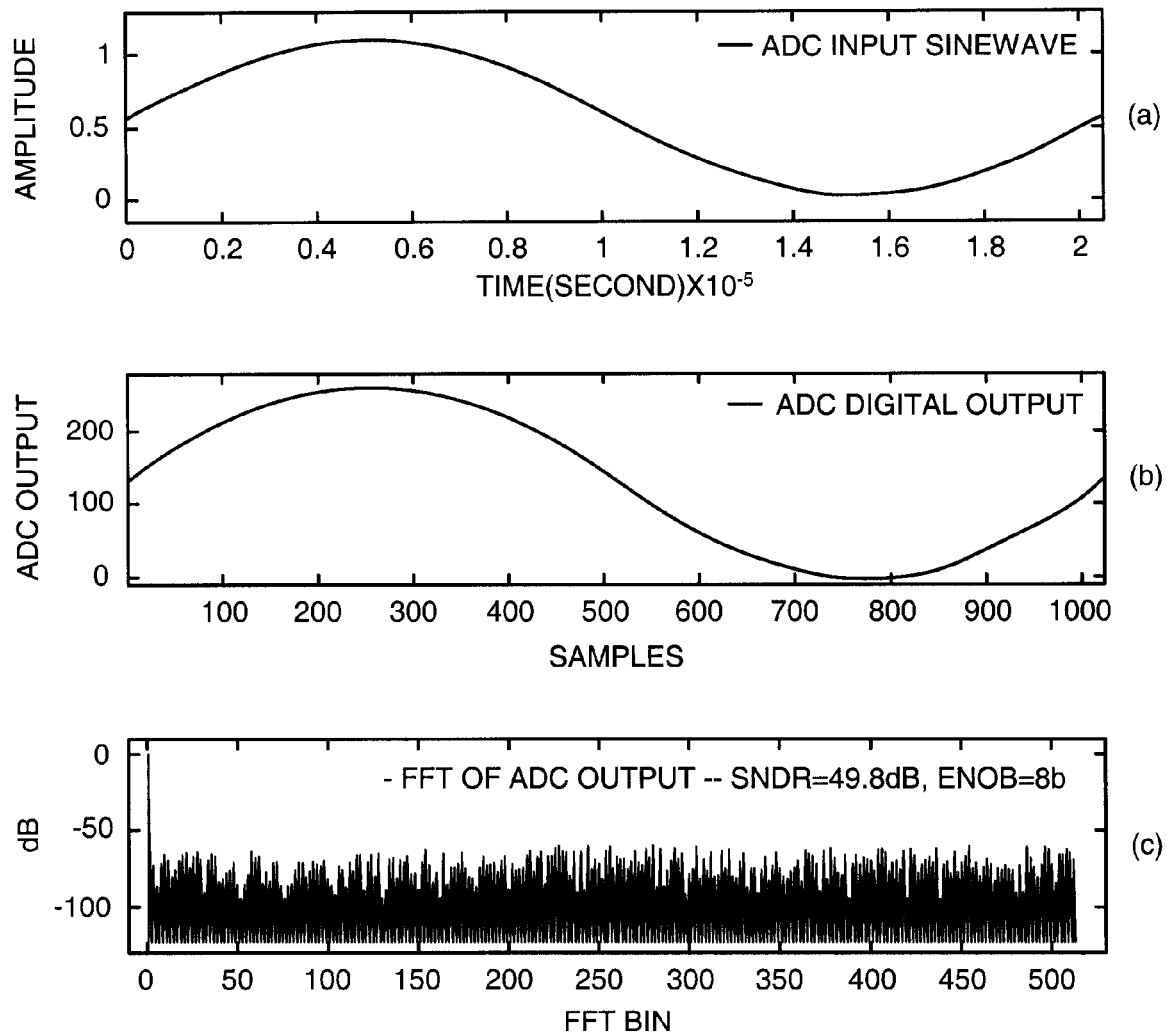
FIGS. 13(a-c) are graphs illustrating MATLAB simulation results of an 8-bit implementation of the ADC 100 of FIG. 2 with a ramping input signal that swings from 0 to $2V_{ref}$, where $V_{ref}$ is 0.6v and the reference voltage shifting technique implemented in accordance with the present invention.

Referring to FIGS. 13(a-c), graphs are shown illustrating MATLAB simulation results for the ADC 100 implemented in accordance with the reference voltage shifting technique of the present invention. With the reference voltage shifting technique implemented in the first stage, the full scale of the ADC 100 may range from 0 to 1.2V. The input signal comprises a 48.3 kHz sine wave and ranges from 0 to 1.2V as plotted in the first graph (FIG. 13a). The second graph (FIG. 13b) illustrates the digital output of the ADC 100. The digital output may range from 0 to 255 covering the full scale of the 8-bit implementation of the ADC 100. Also, a 1024 FFT of the output of the ADC 100 is shown in the last graph (FIG. 13c). With the reference voltage shifting technique of the present invention, the ADC 100 may achieve 8 bits ENOB.

The present invention generally provides a technique that may allow the ADC to utilize more of the signal swing by changing the reference voltages of the pipeline ADC first stage. The present invention may be very useful for DC-coupled signals that are positive or negative only. Pipeline ADCs implemented in accordance with the present invention may be used, for example, in communications, digital versatile disc (DVD) and other applications. For example, a pipeline ADC in accordance with the present invention may be used in DVD-R products to digitize a wobble signal.

The present invention has been illustrated as a number of functional blocks (or circuits). As would be apparent to those of ordinary skill in the field of the present invention, the functional blocks generally illustrating the present invention may or may not be able to be implemented as independent circuits.

While the invention has been particularly shown and described with reference to the preferred embodiments thereof, it will be understood by those skilled in the art that various changes in form and details may be made without departing from the scope of the invention.

The invention claimed is:

1. An apparatus comprising:
a first circuit configured to generate a plurality of digital intermediate signals in response to an analog input signal, said first circuit comprising a plurality of analog-to-digital converter (ADC) stages, each ADC stage configured to generate a respective residual output signal and a respective one of said plurality of digital intermediate signals in response to a respective input signal, a respective set of threshold voltages and a respective set of reference voltages, wherein a first ADC stage receives said analog input signal as the respective input signal, a first set of threshold voltages and a first set of reference voltages and each remaining ADC stage receives the residual output signal from another ADC stage as the respective input signal, a second set of threshold voltages and a second set of reference voltages, wherein the first set of threshold voltages and the first set of reference voltages are shifted with respect to the second set of threshold voltages and the second set of reference voltages by a first predetermined voltage level and a second predetermined voltage level, respectively; and
a second circuit configured to generate a digital output signal in response to the plurality of digital intermediate signals.

2. The apparatus according to claim 1, wherein said second circuit comprises an error correction circuit.

3. The apparatus according to claim 1, wherein said analog signal comprises a dc-coupled signal.

4. The apparatus according to claim 1, wherein each of said plurality of ADC stages comprises a 1.5 bit stage.

5. The apparatus according to claim 1, wherein said first circuit further comprises a flash analog-to-digital converter (ADC) coupled to an output of one of said plurality of ADC stages and configured to generate one of said plurality of digital intermediate signals.

6. The apparatus according to claim 5, wherein said flash analog-to-digital converter (ADC) comprises a 2-bit flash ADC.

7. The apparatus according to claim 1, wherein each of said plurality of ADC stages comprises:
a sample and hold circuit configured to sample the respective input signal;
a sub-ADC configured to generate one of the digital intermediate signals by converting the sample of the respective input signal from the sample and hold circuit from the analog domain to the digital domain based upon the respective set of threshold voltages;
a digital-to-analog converter (DAC) configured to convert the digital intermediate signal from the sub-ADC from the digital domain back to the analog domain based upon the respective set of reference voltages;
an adder configured to generate a residue signal in response to the sample of the respective input signal from the sample and hold circuit and an output of the DAC; and
an amplifier configured to generate the respective residual output signal in response to the residue signal.

8. The apparatus according to claim 1, wherein each of said plurality of ADC stages comprises:
a first comparator circuit configured to generate a first control signal in response to the respective input signal and a first threshold voltage;
a second comparator circuit configured to generate a second control signal in response to the respective input signal and a second threshold voltage;
a latch circuit configured to generate and store an output signal in response to the first control signal and the second control signal;
a multiplexer configured to select between a plurality of voltage levels of the respective set of reference voltages in response to the output signal of the latch circuit; and
an amplifier configured to generate the respective residual output signal in response to the respective input signal, an output of the multiplexer and the respective residual output signal.

9. The apparatus according to claim 8, wherein the first one of said plurality of ADC stages is configured such that:
said first threshold voltage comprises one and one-fourth times a predefined reference voltage;
said second threshold voltage comprises three-fourths times said predefined reference voltage; and
said multiplexer selects between said predefined reference voltage, a voltage level equal to twice said predefined reference voltage and a voltage level equal to three times said predefined reference voltage.

10. The apparatus according to claim 9, wherein each of said plurality of ADC stages after said first ADC stage is configured such that:
said first threshold voltage comprises one-fourth times said predefined reference voltage;
said second threshold voltage comprises one-fourth times a negative version of said predefined reference voltage; and
said multiplexer selects between said predefined reference voltage, said negative version of said predefined reference voltage and a voltage level equal to zero.

11. An apparatus comprising:
means for generating a plurality of digital intermediate signals in response to an analog input signal, a first set of threshold voltages, a first set of reference voltages, a second set of threshold voltages and a second set of reference voltages, wherein the first set of threshold voltages are shifted with respect to the second set of threshold voltages by a first predetermined voltage level and the first set of reference voltages are shifted with respect to the second set of reference voltages by a second predetermined voltage level; and
means for generating a digital output signal in response to the plurality of digital intermediate signals.

12. A method of reference voltage shifting in a pipeline ADC comprising the steps of:
generating a plurality of digital intermediate signals in response to an analog input signal, a first set of threshold voltages, a first set of reference voltages, a second set of threshold voltages and a second set of reference voltages, wherein the first set of threshold voltages are shifted with respect to the second set of threshold voltages by a first predetermined voltage level and the first set of reference voltages are shifted with respect to the second set of reference voltages by a second predetermined voltage level; and
generating a digital output signal in response to the plurality of digital intermediate signals.

13. The method according to claim 12, wherein the step of generating the digital output signal further comprises performing error correction.

14. The method according to claim 12, wherein said plurality of digital intermediate signals are generated using a plurality of stages.

15. The method according to claim 14, wherein one of said plurality of stages comprises a 2 bit flash analog to digital converter (ADC) and all remaining stages of said plurality of stages comprise 1.5 bit ADC stages.

16. The method according to claim 15, wherein each of said 1.5 bit ADC stages comprise:
- a sample and hold circuit configured to sample a respective input signal;
- a sub-ADC configured to generate one of the digital intermediate signals by converting the sample of the respective input signal from the sample and hold circuit from the analog domain to the digital domain based upon a respective set of threshold voltages;
- a digital-to-analog converter (DAC) configured to convert the digital intermediate signal from the sub-ADC from the digital domain back to the analog domain based upon a respective set of reference voltages;
- an adder configured to generate a residue signal in response to the sample of the respective input signal from the sample and hold circuit and an output of the DAC; and
- an amplifier configured to generate a respective residual output signal in response to the residue signal.

17. The method according to claim 15, wherein each of said 1.5 bit ADC stages comprise:
- a first comparator circuit configured to generate a first control signal in response to an input signal and a first threshold voltage;
- a second comparator circuit configured to generate a second control signal in response to the input signal and a second threshold voltage;
- a latch circuit configured to generate and store an output signal in response to the first control signal and the second control signal;
- a multiplexer configured to select between a plurality of reference voltage levels in response to the output signal of the latch circuit; and
- an amplifier configured to generate a residual output signal in response to the input signal, an output of the multiplexer and the residual output signal.

18. The method according to claim 17, wherein a first one of said 1.5 bit ADC stages is configured such that:
- the analog input signal is received as the input signal;
- said first threshold voltage comprises one and one-fourth times a predefined reference voltage;
- said second threshold voltage comprises three-fourths times said predefined reference voltage; and
- said multiplexer selects between said predefined reference voltage, a voltage level equal to twice said predefined reference voltage and a voltage level equal to three times said predefined reference voltage.

19. The method according to claim 18, wherein each of the 1.5 bit ADC stages after the first 1.5 bit ADC stage is configured such that:
- said first threshold voltage comprises one-fourth times said predefined reference voltage;
- said second threshold voltage comprises one-fourth times a negative version of said predefined reference voltage; and
- said multiplexer selects between said predefined reference voltage, said negative version of said predefined reference voltage and a voltage level equal to zero.

\* \* \* \* \*